United States Patent [19]

Paolella et al.

[11] Patent Number: 5,567,973
[45] Date of Patent: Oct. 22, 1996

[54] OPTICAL FIELD-EFFECT TRANSISTOR WITH IMPROVED SENSITIVITY

[75] Inventors: Arthur Paolella, Howell, N.J.; Bahram Nabet, Philadelphia, Pa.

[73] Assignee: The United States of America as represented by the Secretary of the Army, Washington, D.C.

[21] Appl. No.: 511,274

[22] Filed: Aug. 4, 1995

[51] Int. Cl.⁶ .................. H01L 31/062; H01L 31/113
[52] U.S. Cl. .................. 257/257; 257/291; 257/290; 257/258; 257/462; 257/280; 330/308
[58] Field of Search .................. 257/462, 290, 257/291, 187, 188, 294, 293, 257, 258, 280; 330/308

[56] References Cited

U.S. PATENT DOCUMENTS

| | | | |
|---|---|---|---|
| 4,496,964 | 1/1985 | Tsubouchi et al. | 257/290 X |
| 4,739,385 | 4/1988 | Bethea et al. | 257/290 X |
| 4,740,823 | 4/1988 | Thompson | 257/290 X |
| 4,829,346 | 5/1989 | Kasahara et al. | 257/257 X |
| 4,859,965 | 8/1989 | Paolella et al. | 330/285 |

FOREIGN PATENT DOCUMENTS 2172742  9/1986  United Kingdom .................. 257/290

OTHER PUBLICATIONS

No Author, "Photo–Gate FET", *IBM Technical Disclosure Bulletin*, vol. 32, No. 1, Jun. 1989, p. 34.

*Primary Examiner*—William Mintel
*Attorney, Agent, or Firm*—Michael Zelenka; William H. Anderson

[57] ABSTRACT

An FET or MESFET having a semiconductor optically transparent gate. A substrate having a doped channel placed thereon together with a source and a drain with a semiconductor gate formed therebetween may be manufactured using conventional semiconductor manufacturing techniques. The optically transparent highly doped semiconductor gate forms an n+—n junction with the n-type doped channel. This junction is modulated or changed by an optical signal causing a photovoltaic effect that reduces the barrier potential at the n+—n junction resulting in a depletion of the accumulation region. This results in increased flow of current in the doped channel. The transparent highly doped semiconductor gate increases performance of the FET or MESFET optical detector. This is an improvement over conventional metal semiconductor field-effect transistor (MESFET) technology, and can be applied to microwave monolithic integrated circuits (MMIC).

10 Claims, 1 Drawing Sheet

OPTICAL FIELD-EFFECT TRANSISTOR WITH IMPROVED SENSITIVITY

GOVERNMENT INTEREST

The invention described herein may be manufactured, used, and licensed by or for the Government of the United States of America without the payment to us of any royalty thereon.

FIELD OF THE INVENTION

This invention relates in general to optical detectors, and particularly to an improved photo response in field-effect transistor semiconductor devices.

BACKGROUND OF THE INVENTION

There are many applications where an optical detector that can perform light activated switching is desirable. For example, high speed image processing, optical image processing, artificial intelligence circuits, and neural networks. Additionally, in some applications, it may be desirable to provide optical control of microwave monolithic integrated circuits (MMIC). The use of optically activated devices makes possible the use of optical fibers instead of metallic cables. Accordingly, optical devices have many advantages such as reduced size and weight, good electrical insulation and immunity to interference.

One such semiconductor optically controlled device is disclosed in U.S. Pat. No. 4,859,965 entitled "Optical Gain Control of GaAs Microwave Monolithic Integrated Circuit Distributed Amplifier" issuing to Paolella et al on Aug. 22, 1989, which is herein incorporated by reference. Therein disclosed is a field-effect transistor (FET) that is optically controlled, and used in an optical gain control circuit for controlling the gain of a GaAs MMIC distributed amplifier.

While FETs have been used in association with optical illumination in semiconductor devices, there are inefficiencies in that there is poor coupling of the light into the active region of the FET. Recently there has been some research proposing the use of indium tin oxide in a gate which is transparent to light. However, the process to fabricate an indium tin oxide gate is not compatible with conventional microwave device processing techniques.

Accordingly, there is a need for an improved optical FET or metal semiconductor field-effect transistor (MESFET) with increased performance and ease of manufacture that can be incorporated into a MMIC.

SUMMARY OF THE INVENTION

The present invention is a field-effect transistor (FET) or metal semiconductor field-effect transistor (MESFET) that functions as an optical detector. An n-type doped channel is formed on a substrate. On top of the n-type doped channel is formed an ohmic source and an ohmic drain. Between the ohmic source and the ohmic drain and during the same processing step is formed a thin semiconductor gate. The semiconductor gate may be contacted at one end by a metal contact for electrical biasing. The thin semiconductor gate is optically transparent. The optically transparent semiconductor gate is highly doped. An n+—n junction is formed between the highly doped semiconductor gate and the doped channel. Therefore, an accumulation region is formed constricting current in the n-type doped channel. Upon illumination of the semiconductor gate, the photovoltaic effect reduces the barrier potential and the depth of the accumulation region. The optically transparent semiconductor gate greatly increases optical sensitivity of the optical FET or MESFET, and is compatible with conventional semiconductor processing techniques.

Accordingly, it is an object of the present invention to provide an optical detector FET or MESFET that is easy to manufacture and incorporate in a monolithic device.

It is another object of the present invention to provide an optical FET or MESFET that can be manufactured without additional processing steps.

It is a further object of the present invention to provide an optical FET or MESFET having improved performance and sensitivity.

It is an advantage of the present invention that it may be manufactured with conventional semiconductor manufacturing techniques.

It is a feature of the present invention that the optically transparent gate is made from the same layer as the source and drain ohmic contacts.

It is a feature of the present invention that the gate is optically transparent.

Accordingly, these and other objects, advantages, and features will become even more readily apparent in view of the following detailed description.

DETAILED DESCRIPTION OF THE PREFERRED EMBODIMENTS

Figure 1:
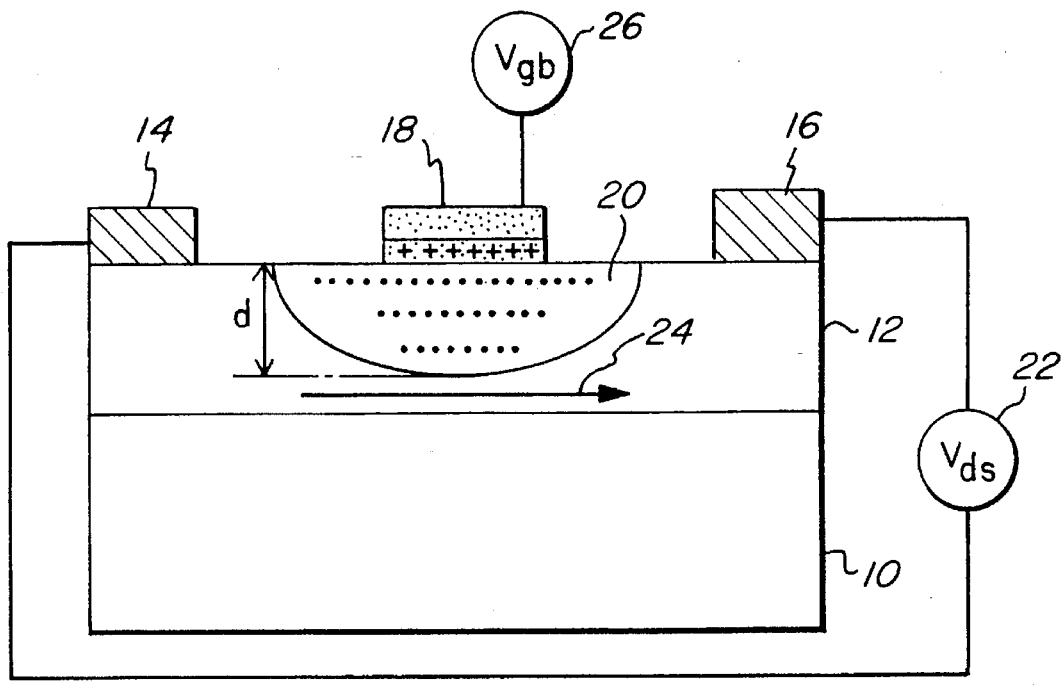
FIG. 1 is a schematic illustration of the present invention.

FIG. 1 illustrates a field-effect transistor according to the present invention. A substrate 10 which may be a semi-insulating GaAs substrate has an n-type doped channel 12 formed thereon. The n-type doped channel 12 may be fabricated by ion implantation or epitaxial growth. The n-type doped channel 12 is doped with a carrier concentration of approximately $10^{16}$ cm$^{-3}$. Placed on top of the n-type doped channel 12 is ohmic source 14, ohmic drain 16 and optically transparent semiconductor gate 18. The optically transparent semiconductor gate 18 is an "n+" semiconductor doped to a carrier concentration of approximately $10^{18}$ cm$^{-3}$ or greater to approximately $10^{19}$ cm$^{-3}$. The carrier concentration of the semiconductor gate 18 is greater than that of the doped channel 12. The semiconductor gate 18 is fabricated on top of the doped channel 12 during the same manufacturing step which delineates the n+ layer required for ohmic source 14 and ohmic drain 16. The Semiconductor "n+" gate 18 may be contacted at one end by a metal contact (not shown) for electrical biasing with voltage source $V_{gb}$ 26, if desired. The electrical biasing of the semiconductor gate 18 permits control of the characteristics of the photoresponse. Under the semiconductor gate 18 and within the doped channel 12 is an accumulation region 20. The accumulation region 20 has a depth d. Applied between the ohmic source 14 and the ohmic drain 16 is a bias voltage $V_{ds}$ 22. The biasing of the ohmic source 14 and ohmic drain 16 results in a channel current to flow in the direction indicated by arrow 24. However, the accumulation region 20 within doped channel 12 effectively restricts the channel current flow represented by arrow 24. The accumulation region 20 is the result of the difference in the electrostatic potential of the semiconductor gate 18 and the doped channel 12. The junction between the doped channel 12 and the semiconductor gate 18 is called an n+—n junction. At this junction there is a barrier potential $V_b$. The barrier potential $V_b$ is defined by the following equation:

$$V_b = \frac{kT}{q} \operatorname{Ln}\left(\frac{n_g}{n_c}\right)$$

wherein $n_g$ is the carrier concentration of the semiconductor gate 18 and $n_c$ is the carrier concentration of the doped channel 12. The present invention permits the modulation of the n+—n junction by an optical signal.

Figure 2:
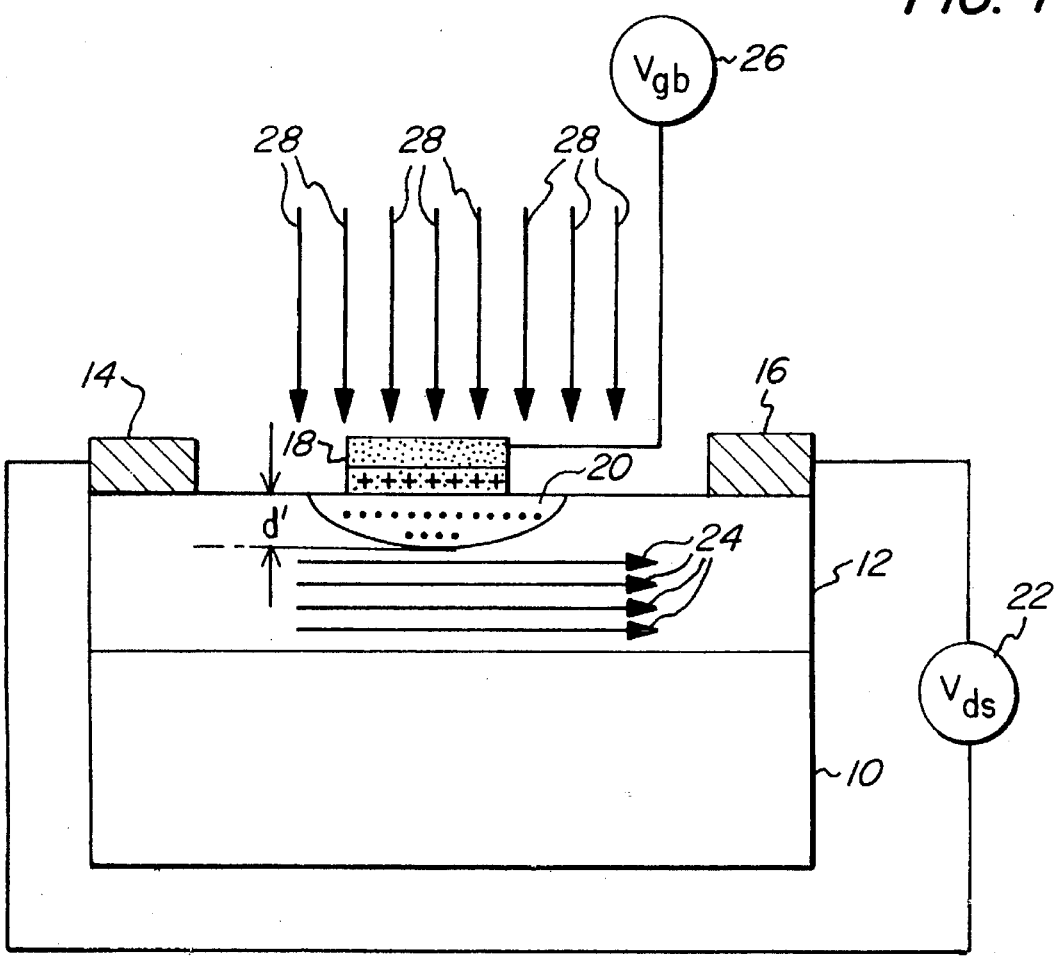
FIG. 2 is a schematic illustration of the present invention having an optical sign applied thereto.

FIG. 2 illustrate how an optical signal or electromagnetic radiation such as light represented by arrows 28 modulate or change the depth d' of the accumulation region 20 in the doped channel 12 beneath the semiconductor gate 18. Upon illumination from an illumination source (not shown), the photovoltaic effect reduces the barrier potential at the n+—n junction between the doped channel 12 and the semiconductor gate 18 by establishing a voltage $V_{opt}$. A photo voltage $V_{ph}$ is defined as:

$$V_{ph} = V_b - V_{opt}$$

The reduction of the barrier potential reduces the depth d' of the accumulation region 20 allowing more current to flow in the doped channel 12. Accordingly, a photo current $I_{ph}$ is established within the doped channel 12. The photo current $I_{ph}$ is defined as:

$$I_{ph} = g_m V_{ph}$$

where $G_m$ is the transconductance of the device.

The illumination source may be any device such as an LED or diode laser operating at a wavelength for which the semiconductor gate 18 will transmit the electromagnetic radiation for producing the photovoltaic effect, and thereby reducing the barrier potential at the n+—n junction between the semiconductor gate 18 and the doped channel 12.

Accordingly, the present invention provides a semiconductor gate that improves optical coupling and takes advantage of the photovoltaic effect at the n+—n junction to enhance the photocurrent compared to a conventional FET or MESFET. Additionally, a gate contact allows for the electrical biasing of the gate, thus control ling the characters of the photo response. The present invention therefore, finds many applications in providing improved performance with a smaller size and higher reliability that is particularly adapted to a monolithic form on a single gallium arsenide (GaAs) MMIC device. The device of the present invention can also be used in microwave photonic high speed circuits as well as array structures for electronic image processors. Only a few examples of the usefulness of the present invention have been illustrated. However, it will be obvious for artisans skilled in other arts to apply the teachings of this invention to their respective arts. Additionally, although the preferred embodiment gas been illustrated and described, it will be obvious to those skilled in the art that various modifications may be made without departing from the spirit and scope of this invention.

What is claimed is:

1. An optically sensitive semiconductor device comprising:
    a substrate;
    a doped channel placed on said substrate;
    an ohmic source placed on said doped channel;
    an ohmic drain placed on said doped channel; and
    an optically transparent semiconductor gate placed on said doped channel between said ohmic source and said ohmic drain.

2. An optically sensitive semiconductor device as in claim 1 wherein:
    said doped channel is an n-type doped material.

3. An optically sensitive semiconductor device as in claim 2 wherein:
    said optically transparent semiconductor gate is an n-type semiconductor.

4. An optically sensitive semiconductor device as in claim 3 wherein:
    said doped channel has a carrier concentration less than that of said semiconductor gate.

5. An optically sensitive semiconductor device as in claim 4 wherein:
    said doped channel has a carrier concentration of approximately $10^{16}$ per cubic centimeter; and
    said semiconductor gate has a carrier concentration of between approximately $10^{18}$ and $10^{19}$ per cubic centimeter.

6. An optically sensitive semiconductor device as in claim 1 further comprising:
    a bias voltage applied between said ohmic source and said ohmic drain.

7. An optically sensitive semiconductor device as in claim 1 further comprising:
    a bias voltage applied to said semiconductor gate.

8. An optically sensitive semiconductor device as in claim 1 wherein:
    said optically transparent gate is transparent to a predetermined wavelength of electromagnetic radiation.

9. An optically sensitive semiconductor device as in claim 8 wherein:
    the predetermined wavelength of electromagnetic radiation is the wavelength that causes a photovoltaic effect whereby a barrier potential between said doped channel and said semiconductor gate is reduced.

10. An optically sensitive semiconductor device comprising:
    a gallium arsenide substrate;
    an n-type doped channel having a first carrier concentration placed on said substrate, said n-type doped channel having a first and second end;
    an ohmic source placed at the first end of said n-type doped channel;
    an ohmic drain placed at the second end of said n-type doped channel; and
    an optically transparent doped semiconductor gate placed on said n-type doped channel between said ohmic source and said ohmic drain, said optically transparent doped semiconductor gate having a second carrier concentration;
    the second carrier concentration of said optically transparent doped semiconductor gate being greater than the first carrier concentration of said n-type doped channel;
    whereby an n+—n junction is formed between said n-type channel and said optically transparent doped semiconductor gate forming an accumulation region therebetween, such that when an illumination source is directed onto said optically transparent doped semiconductor gate a photovoltaic effect modulates the accumulation region resulting in a changed current flow between said ohmic source and said ohmic drain.

* * * * *